United States Patent
Zhang et al.

(10) Patent No.: US 6,441,417 B1
(45) Date of Patent: Aug. 27, 2002

(54) SINGLE C-AXIS PGO THIN FILM ON ZRO2 FOR NON-VOLATILE MEMORY APPLICATIONS AND METHODS OF MAKING THE SAME

(75) Inventors: Fengyan Zhang; Yanjun Ma; Jer-Shen Maa; Wei-Wei Zhuang, all of Vancouver; Sheng Teng Hsu, Camas, all of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/820,022

(22) Filed: Mar. 28, 2001

(51) Int. Cl.[7] .............................................. H01L 29/72
(52) U.S. Cl. ........................ 257/295; 257/410; 257/412
(58) Field of Search ................................ 257/295, 410, 257/412

(56) References Cited

U.S. PATENT DOCUMENTS 6,190,925 B1  2/2001  Li et al.

OTHER PUBLICATIONS

Kanashima, Takeshi, Analysis of High Frequency Capacitance–Voltage Characteristics of Metal–Ferroelectrics–Insulator–Silicon Structure, Jpn. J. Appl. Phys. 38 (1999) 2044.

Lee, Won–Jae, Electrical Properties of $SrBi_2Ta_2Da$/Insulator/Si Structures with Various Insulators, Jpn. J. Appl. Phys. 38 (1999) 2039.

Hirai, Tadahiko, Preparation of $SrBi_2Ta_2Da$ Film at low Temperatures and Fabrication of a Metal/Ferroelectric/Insurlator/Semiconductor Field Effect Transistor Using Al/$SrBi_2TaDq$/Ce $D_2$/Si (IDO) Structures, Jpn. J. Appl. Phys. 36 (1997) 5908.

Hirai, Tadahiko, Preparation of $SrBi_2Ta_2Da$ Film at low Temperatures and Fabrication of a Metal/Ferroelectric/Insurlator/Semiconductor Field Effect Transistor Using Al/$SrBi_2TaDa$/Ce $D_2$/Si (IDO) Structures, Jpn. J. Appl. Phys. 36 (1997) 5908.

Primary Examiner—Edward Wojciechowicz
(74) Attorney, Agent, or Firm—David C. Ripma; Matthew D. Rabdau; Scott C. Krieger

(57) ABSTRACT

A thin film structure includes a substantially single-phase, c-axis PGO film on an insulator for use in metal ferroelectric insulator semiconductor single transistor non-volatile memory applications. The PGO on insulator structure can also be used in capacitors, pyroelectric infrared sensors, optical displays, optical switches, piezoelectric transducers, and surface acoustic wave devices. In a preferred embodiment, the PGO film is deposited on a Zirconium Oxide insulator layer.

13 Claims, 3 Drawing Sheets

XRD SPECTRUM OF PGO THIN FILM ON ZrO₂ SUBSTRATE

HIGH FREQUENCY CV MEASUREMENT OF A MFIS (=Pt/PGO/ZrO$_2$/Si) CAPACITOR

CV MEASUREMENT OF A Pt/PGO (180nm)/Ir CAPACITOR STRUCTURE

LEAKAGE CURRENT OF PGO/ZrO$_2$ FILM

SINGLE C-AXIS PGO THIN FILM ON ZRO2 FOR NON-VOLATILE MEMORY APPLICATIONS AND METHODS OF MAKING THE SAME

FIELD OF THE INVENTION

This invention relates to a single c-axis Lead Germanium Oxide (PGO) thin film on an insulator layer for non-volatile memory applications and methods of making the same and, more particularly, to a PGO thin film on a Zirconium Oxide ($ZrO_2$) insulator for ferroelectric random access memory (FeRAM) and dynamic random access memory (DRAM) applications.

BACKGROUND OF THE INVENTION

Lead Germanium Oxide (PGO or $Pb_5Ge_3O_{11}$) is a well-known ferroelectric material. Pure c-axis oriented PGO thin films have been successfully grown on Iridium (Ir), Platinum (Pt), Platinum/Iridium (Pt/Ir) and Iridium-Tantalum-Oxygen (Ir—Ta—O) conductive electrodes. These structures can be used for metal ferroelectric metal oxide semiconductor (MFMOS) single transistor memory applications.

Ferroelectric devices have also been manufactured with $SrBi_2Ta_2O_9$ (SBT). Unlike the ferroelectric material SBT, which exhibits ferroelectric properties with a polycrystalline structure, PGO only exhibits ferroelectric properties when it is c-axis oriented. However, it is rather difficult to grow single-phase c-axis PGO films on insulators because PGO films usually exhibit amorphous or polycrystalline structure.

Metal ferroelectric semiconductor field effect transistors (MFSFET) are an attractive alternative to MFMOS. However, a strong interaction between the PGO film and the Silicon precludes the fabrication of such devices using a PGO ferroelectric layer. Metal ferroelectric insulator semiconductor field effect transistors (MFISFET) have also been investigated because their structure is simpler than that of MFMOS structures. However, heretofore, good insulator films for fabrication of MFISFET devices, which include a PGO ferroelectric layer, have not been found. Accordingly, there is a need for finding a good insulator film that allows for the fabrication of MFISFET devices having a PGO ferroelectric layer.

SUMMARY OF THE INVENTION

The invention comprises a new thin film structure, including a single-phase c-axis PGO film on an insulator, such as $ZrO_2$, for metal ferroelectric insulator semiconductor single transistor non-volatile memory applications. This PGO-on-insulator structure can also be used in capacitors, pyroelectric infrared sensors, optical displays, optical switches, piezoelectric transducers, and surface acoustic wave devices.

Accordingly, an object of the invention is to provide a MFIS transistor structure including a PGO ferroelectric film.

Another object of the invention is to provide a MFIS transistor structure including a $ZrO_2$ insulator film.

A further object of the invention is to provide a MFIS transistor structure including a PGO ferroelectric layer on an insulator layer.

DETAILED DESCRIPTION OF THE PREFERRED EMBODIMENTS

Figure 1:
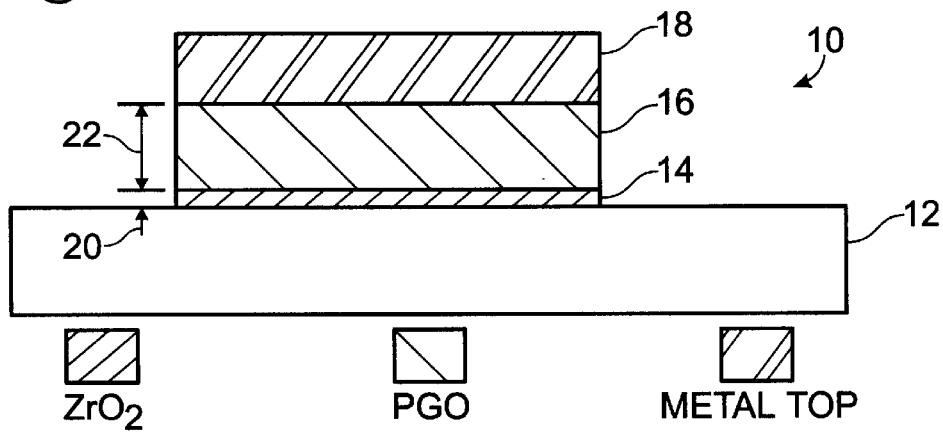
FIG. 1 is a schematic of the inventive PGO ferroelectric film on an insulator film.

Turning now to the drawings, FIG. 1 shows a schematic of the inventive device. Device 10 includes a Semiconductor substrate 12 such as a Silicon substrate. An Insulator film 14, such as $ZrO_2$, is positioned on substrate 12. A ferroelectric layer 16, namely, a substantially single phase, c-axis $Pb_5Ge_3O_{11}$(PGO) film, is positioned on insulator film 14. A metal top electrode 18 is positioned on PGO film 16.

A typical method for preparing such a structure may include the following steps. First, the semiconductor substrate is prepared using any state of the art process including isolation and well formation. Second, the insulator film, such as $ZrO_2$, is deposited by any of the following means: physical vapor deposition (PVD); evaporation and oxidation; chemical vapor deposition (CVD); and atomic layer deposition. Any necessary post deposition anneal may include annealing in forming gas or Oxygen ambient at a temperature up to 800 degrees Celsius. Third, the PGO film is deposited by any of the following methods: spin-on; physical vapor deposition; CVD; metal organic CVD (MOCVD); chemical solution deposition (CSD); and laser ablation. Fourth, the metal gate electrode is deposited on the PGO layer by any means known in the art. Fifth, the contact and interconnect formations are made.

As an example, the following device was manufactured. $ZrO_2$ was sputtered-deposited onto a clean Silicon wafer by reactive sputtering of a Zirconium target in an Oxygen ambient. The film thickness 20, as measured by spectroscopic ellipsometry, was 135 Angstroms. The thickness of the insulator layer typically will be greater than at least 20 Angstroms. The PGO thin film 16 was spin coated using lead acetate ($Pb(OAc)_2$ $3H_2O$) and germanium isopropoxide (Ge $(OPr^i)_4$) in 2-(2-ethoxyethoxy) ethanol solution ($H(OC_2H_4OC_2H_4OC_2H_5)$), heated with an air exposure until a deep red brown color. The Lead to Germanium ratio (Pb/Ge) was 5.25/3. The baking temperature was approximately 50 to 350 degrees Celsius for 30 seconds to 3600 seconds. The annealing temperature after each spin-on layer was approximately 400 to 550 degrees Celsius for 30 seconds to 3600 seconds. The final annealing temperature was approximately 450 to 600 degrees Celsius for five minutes to three hours. The thickness 22 of the PGO layer 16 was approximately 1600 Angstroms and typically will be in a range of 100 Angstroms to 5000 Angstroms. The phases of the deposited PGO layer were examined by X-ray diffraction.

Figure 2:
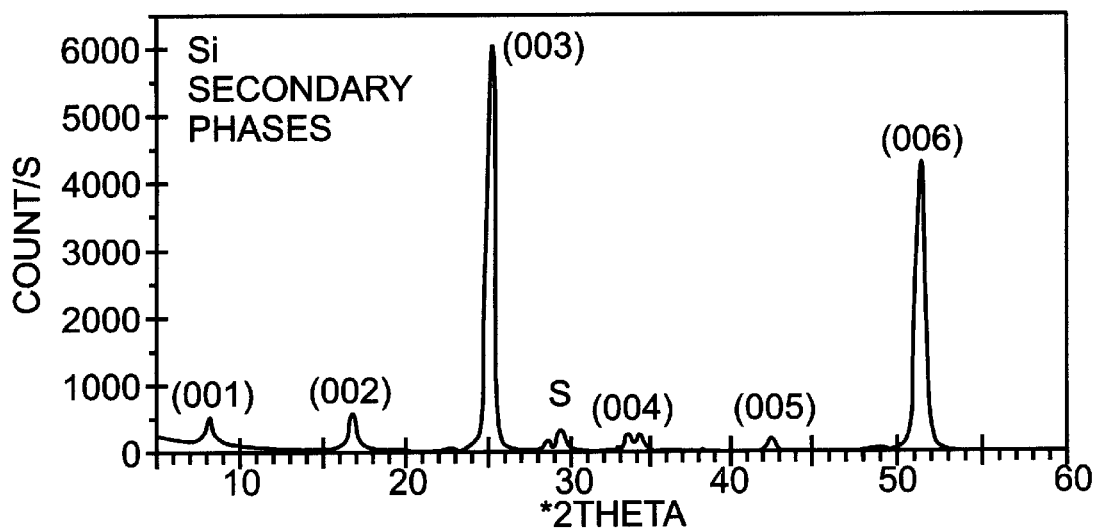
FIG. 2 is a graph of an X-ray diffraction spectrum of a PGO film on a $ZrO_2$ insulator film.

FIG. 2 is a graph of an X-ray diffraction spectrum of a PGO film on a $ZrO_2$ substrate, as manufactured by the steps listed above. The x-axis represents two-times-theta (degrees) and the y-axis represents counts per second. The graph shows that substantially pure c-axis PGO was obtained on the $ZrO_2$ substrate, as shown by the peaks labeled (001), (002), (003), (004), (005) and (006). No other peaks are observed (except for minimal peaks at 29 degrees), which indicates that no reaction, or only a minimal reaction (as shown by the secondary phases at 29 degrees), occurred at the interface of the PGO and $ZrO_2$ layers.

Figure 3:
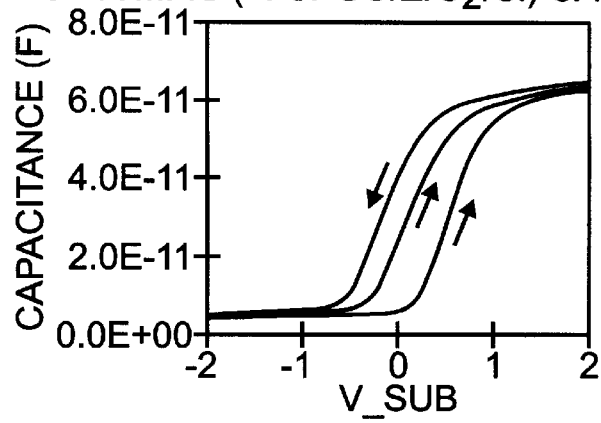
FIG. 3 is a graph of a high frequency Capacitance-Voltage (CV) measurement of a metal ferroelectric insulator semiconductor (MFIS) capacitor comprising Pt/PGO/$ZrO_2$/Si.

FIG. 3 is a graph of a high frequency Capacitance-Voltage (CV) measurement of a metal ferroelectric insulator semiconductor (MFIS) capacitor comprising Pt/PGO/$ZrO_2$/Si. The x-axis shows voltage and the y-axis shows Capacitance. In order to measure the memory windows of a PGO thin film on a $ZrO_2$ substrate, a Platinum (Pt) top electrode was deposited on the PGO surface with a shallow mask. The area of the top electrode was approximately $4\times10^{-4} cm^2$. The PGO film had a thickness of approximately 1600 Angstroms and the $ZrO_2$ layer had a thickness of approximately 130 Angstroms. The hysteresis in the C-V curve indicates a memory window of approximately 0.7 volts. The memory window typically will be between 0.1 to 3.0 volts. This is less than the 1.3 volt memory window for an 1800 Angstrom PGO film in a metal ferroelectric metal (MFM) structure.

Figure 4:
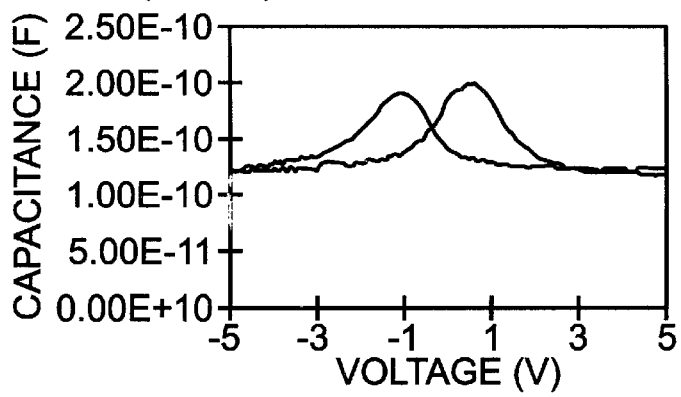
FIG. 4 is a graph of a Capacitance-Voltage (CV) measurement of a Pt/PGO(180 nm)/Ir capacitor structure.
Figure 5:
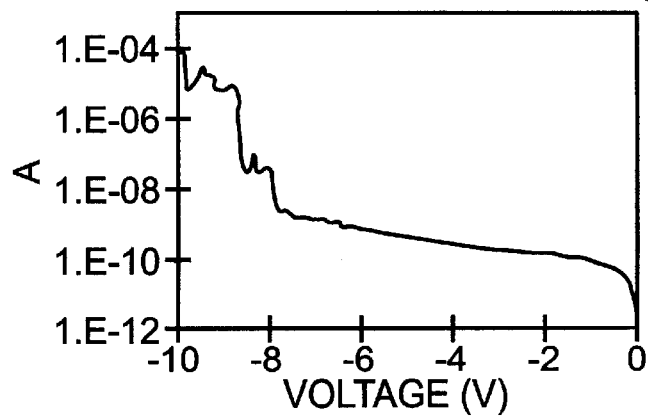
FIG. 5 is a graph of a leakage current (I-V) of a PGO/$ZrO_2$ film.

FIG. 4 is a graph of a Capacitance-Voltage (CV) measurement of a Pt/PGO(180 nm)/Ir capacitor structure. The memory window shown is about 1.8 volts. FIG. 5 is a graph of a leakage current (I-V) of a PGO film on a $ZrO_2$ film. As shown by the graph, the leakage current though the PGO/$ZrO_2$ structure is very small, indicating that a good interface is maintained between the PGO, the $ZrO_2$ and the Silicon substrate. In particular, the leakage current typically is less than $1\times10^{-6}$ $A/cm^2$ at 100 KV/cm.

Figure 6:
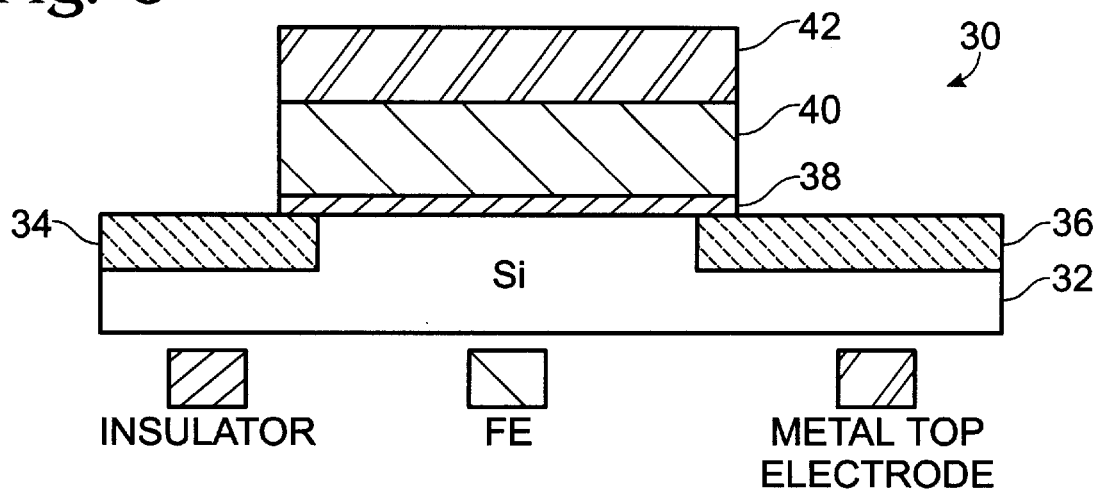
FIG. 6 is a schematic of a metal ferroelectric insulator semiconductor field effect transistor including a PGO layer on an insulator structure.

FIG. 6 is a schematic of a preferred embodiment of the composite PGO/insulator layered structure, namely, a metal ferroelectric insulator semiconductor field effect transistor (MFISFET) including a PGO film on an insulator layer. Device 30 includes a Semiconductor substrate 32 such as a Silicon substrate, including a source region 34 and a drain region 36. An Insulator film 38 is positioned on substrate 32. Insulator film 38 may comprise Zirconium Oxide ($ZrO_2$), Hafnium Oxide ($HfO_2$), silicates of Zirconium or Hafnium, or mixtures of the above. The insulator film 38 may also comprise Aluminum Oxide, Yttrium Oxide, Calcium Oxide, Lanthanum Oxide, Titanium Oxide ($TiO_2$), Tantalum Oxide ($Ta_2O_5$), doped $ZrO_2$ or doped $HfO_2$, Zr—Al—O, Hf—Al—O, Zr—Ti—O, Hf—Ti—and La—Al—O, and combinations thereof. The ferroelectric layer 40 comprises a single phase, c-axis $Pb_5Ge_3O_{11}$(PGO) film, positioned on insulator film 38. The ferroelectric PGO layer may be deposited by the method set forth in U.S. Patent Registration No. 6,190,925, issued on Feb. 20, 2001, assigned to Sharp Laboratories of America, Inc., and entitled Epitaxially Grown Lead Germanate Film and Deposition Method, wherein said patent is incorporated herein by reference. By use of the disclosed PGO deposition method as set forth in the above listed patent, a PGO layer can be deposited with a substantially c-axis crystalline orientation, i.e., more than a 70% c-axis orientation, but may be as high as 80%. In a preferred embodiment, the PGO layer will have approximately a 90% c-axis orientation or better. A metal top electrode 42 is positioned on PGO film 40. The metal top electrode may comprise Platinum (Pt), Iridium (Ir), Tantalum (Ta), Ruthenium (Ru) or conductive oxides or alloys.

Figure 7:
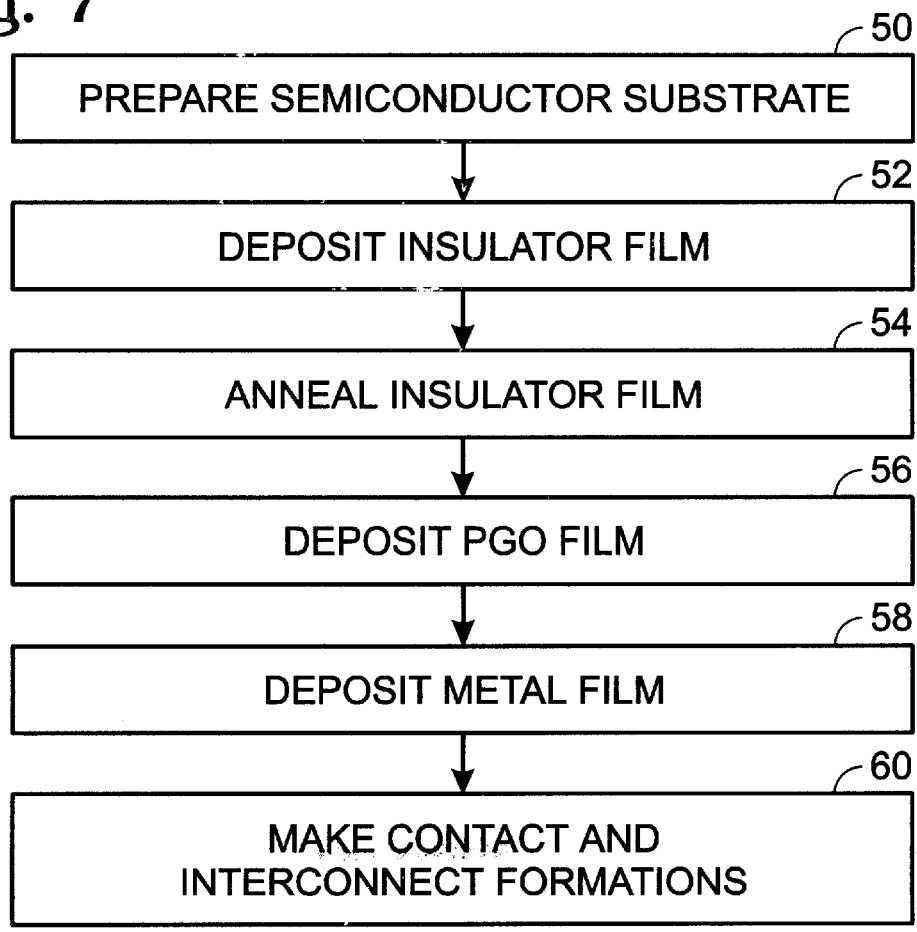
FIG. 7 is a flowchart of the method of making the PGO-on-insulator structure of the present invention.

FIG. 7 is a flowchart of the method of making the PGO-on-insulator structure of the present invention. Step 50 comprises preparing the semiconductor substrate using any state of the art process including isolation and well formation. Step 52 comprises depositing the insulator film by any of the following means: physical vapor deposition (PVD); evaporation and oxidation; chemical vapor deposition (CVD); and atomic layer deposition. Step 54, if required, comprises post deposition annealing of the insulator film in forming gas or Oxygen ambient at a temperature up to 800 degrees Celsius. Step 56 comprises depositing the PGO film by any of the following methods: spin-on; physical vapor deposition; CVD; metal organic CVD (MOCVD); chemical solution deposition (CSD); and laser ablation. Step 58 comprises depositing the metal gate electrode on the PGO layer by any means known in the art. Step 60 comprises making any required contact and interconnect formations.

Thus, a single-phase, c-axis PGO thin film on an insulator for non-volatile memory applications, and a method for making the same, has been disclosed. Although preferred structures and methods of manufacturing the device have been disclosed, it should be appreciated that further variations and modifications may be made thereto without departing from the scope of the invention as defined in the appended claims.

We claim:

1. A metal ferroelectric insulator semiconductor field effect transistor comprising:
   a semiconductor including a source region, a drain region and a gate region positioned therebetween;
   a layer of insulator material positioned on said gate region of said semiconductor; and
   a layer of PGO positioned on said layer of insulator material in said gate region of said semiconductor.

2. The transistor of claim 1 wherein said insulator material is chosen from the group consisting of: Zirconium Oxide ($ZrO_2$), Hafnium Oxide ($HfO_2$), silicates of Zirconium, silicates of Hafnium, Aluminum Oxide, Yttrium Oxide, Calcium Oxide, Lanthanum Oxide, Titanium Oxide ($TiO_2$), Tantalum Oxide ($Ta_2O_5$), doped $ZrO_2$, doped $HfO_2$, ZrAl—O,Hf—Al—O, Zr—Ti—O, Hf—Ti—O, La—Al—O, and combinations thereof.

3. The transistor of claim 1 further comprising a top electrode layer positioned on said layer of PGO, wherein said top electrode layer is manufactured of a material chosen from the group consisting of: Platinum (Pt); Iridium (Ir); Tantalum (Ta); Ruthenium (Ru); a conductive oxide; and a conductive alloy.

4. The transistor of claim 1 wherein said layer of PGO comprises a single phase having a c-axis orientation throughout at least 70% of said layer of PGO.

5. The transistor of claim 3 wherein said transistor has a memory window in a range of 0.1 to 3.0 volts.

6. The transistor of claim 1 wherein said layer of PGO has an at least 80% single-phase, c-axis orientation.

7. A thin film semiconductor structure comprising:
   a substrate including an active region positioned between a source region and a drain region;
   a layer of Zirconium Oxide positioned on said active region of said substrate; and
   a ferroelectric layer of substantially single phase, c-axis oriented PGO positioned on said Zirconium Oxide layer.

8. The structure of claim 7 wherein said semiconductor structure is chosen from the group consisting of: a transistor; a capacitor; a pyroelectric infrared sensor; an optical display; an optical switch; a piezoelectric transducer; and a surface acoustic wave device.

9. The structure of claim 7 wherein said substrate comprises Silicon.

10. The structure of claim 7 wherein said semiconductor structure is a non-volatile memory device.

11. The structure of claim 7 further comprising an electrode positioned on said ferroelectric layer.

12. The structure of claim 7 wherein said ferroelectric layer has a thickness of at least 100 Angstroms.

13. The structure of claim 11 wherein said layer of Zirconium Oxide and said ferroelectric layer define a leakage current, and wherein said leakage current is less than $1\times10^{-6}$ A/cm$^2$ at 100 KV/cm.

* * * * *